(12) United States Patent
Kurata et al.

(10) Patent No.: US 11,961,932 B2
(45) Date of Patent: Apr. 16, 2024

(54) PHOTODETECTOR

(71) Applicant: SONY SEMICONDUCTOR SOLUTIONS CORPORATION, Kanagawa (JP)

(72) Inventors: Kenji Kurata, Kanagawa (JP); Yusuke Otake, Kanagawa (JP); Yuji Isogai, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 301 days.

(21) Appl. No.: 17/434,944

(22) PCT Filed: Feb. 28, 2020

(86) PCT No.: PCT/JP2020/008228
§ 371 (c)(1),
(2) Date: Aug. 30, 2021

(87) PCT Pub. No.: WO2020/184213
PCT Pub. Date: Sep. 17, 2020

(65) Prior Publication Data
US 2022/0149221 A1    May 12, 2022

(30) Foreign Application Priority Data
Mar. 11, 2019 (JP) .................................. 2019-043344

(51) Int. Cl.
*H01L 31/107* (2006.01)
*H01L 31/0232* (2014.01)
*H01L 31/0352* (2006.01)

(52) U.S. Cl.
CPC ...... *H01L 31/107* (2013.01); *H01L 31/02327* (2013.01); *H01L 31/035281* (2013.01)

(58) Field of Classification Search
CPC .................................................... H01L 31/107
See application file for complete search history.

(56) References Cited

U.S. PATENT DOCUMENTS

2018/0026147 A1    1/2018  Zhang et al.
2018/0090526 A1    3/2018  Mandai et al.
(Continued)

FOREIGN PATENT DOCUMENTS

JP      2018-088488 A     6/2018
JP      2018-201005 A    12/2018
(Continued)

OTHER PUBLICATIONS

International Search Report and Written Opinion of PCT Application No. PCT/JP2020/008228, dated Jun. 2, 2020, 08 pages of ISRWO.

*Primary Examiner* — Suberr L Chi
(74) *Attorney, Agent, or Firm* — CHIP LAW GROUP

(57) ABSTRACT

A photodetector comprising: a separation region that is provided in a semiconductor substrate and defines a pixel region; a hole accumulation region that is provided in the semiconductor substrate of the pixel region along a side surface of the separation region; a multiplication region that is provided in the semiconductor substrate of the pixel region and is configured by joining a first conductivity type region and a second conductivity type region from the surface side of the semiconductor substrate in the thickness direction of the semiconductor substrate; and an insulating region provided in the semiconductor substrate in a region between the multiplication region and the hole accumulation region, wherein a formation depth of the insulating region is larger than a formation depth of the first conductivity type region.

17 Claims, 18 Drawing Sheets

(56) References Cited

U.S. PATENT DOCUMENTS

| | | |
|---|---|---|
| 2019/0006399 A1 | 1/2019 | Otake et al. |
| 2019/0252442 A1 | 8/2019 | Tanaka et al. |
| 2020/0099003 A1* | 3/2020 | Ujiie ................... H10K 85/636 |

FOREIGN PATENT DOCUMENTS

| | | |
|---|---|---|
| JP | 2019-530215 A | 10/2019 |
| WO | 2018/057975 A1 | 3/2018 |
| WO | 2018/074530 A1 | 4/2018 |
| WO | 2018/101033 A1 | 6/2018 |

* cited by examiner

PHOTODETECTOR

CROSS REFERENCE TO RELATED APPLICATIONS

This application is a U.S. National Phase of International Patent Application No. PCT/JP2020/008228 filed on Feb. 28, 2020, which claims priority benefit of Japanese Patent Application No. JP 2019-043344 filed in the Japan Patent Office on Mar. 11, 2019. Each of the above-referenced applications is hereby incorporated herein by reference in its entirety.

TECHNICAL FIELD

The present disclosure relates to a photodetector.

BACKGROUND ART

An avalanche photodiode (APD) is known as a photodiode that converts light into electrons. The APD is a photodiode capable of achieving a photoelectric conversion efficiency of more than 100% by utilizing an avalanche phenomenon.

In particular, in an APD operated at an applied voltage higher than a breakdown voltage, an electron avalanche can be generated by carriers produced by photoelectric conversion, thereby making it possible to multiply carriers. Such an APD can also detect a single photon, and is therefore also referred to as a single photon avalanche photodiode (SPAD).

For example, PTL 1 below discloses a technique for reducing crosstalk to adjacent pixels by forming a separation region between pixels in a photodiode array in which SPADs are arranged.

CITATION LIST

Patent Literature

[PTL 1]
WO 2018/074530

SUMMARY

Technical Problem

However, suppression of edge breakdown in the SPAD described in PTL 1 has not been sufficiently studied. Edge breakdown is a phenomenon in which an electric field is locally increased by a structure and the like, resulting in unintentional breakdown. In a SPAD, a high electric field is applied to a pn junction, so it is important to suppress such edge breakdown.

For example, in order to suppress edge breakdown, it is conceivable to increase the distance between a cathode and an anode of a SPAD. However, in such a case, since the area of the SPAD becomes large, it becomes difficult to miniaturize and increase the density of a pixel array when forming a pixel array in which a plurality of SPADs is arranged in a matrix.

Accordingly, the present disclosure proposes a new and usable photodetector in which edge breakdown can be suppressed by a structure suitable for miniaturization and increase in density.

Solution to Problem

The present disclosure provides a photodetector comprising: a separation region that is provided in a semiconductor substrate and defines a pixel region; a hole accumulation region that is provided in the semiconductor substrate of the pixel region along a side surface of the separation region; a multiplication region that is provided in the semiconductor substrate of the pixel region and is configured by joining a first conductivity type region and a second conductivity type region from the surface side of the semiconductor substrate in the thickness direction of the semiconductor substrate; and an insulating region provided in the semiconductor substrate in a region between the multiplication region and the hole accumulation region, wherein a formation depth of the insulating region is larger than a formation depth of the first conductivity type region.

DESCRIPTION OF EMBODIMENTS

Figure 1:
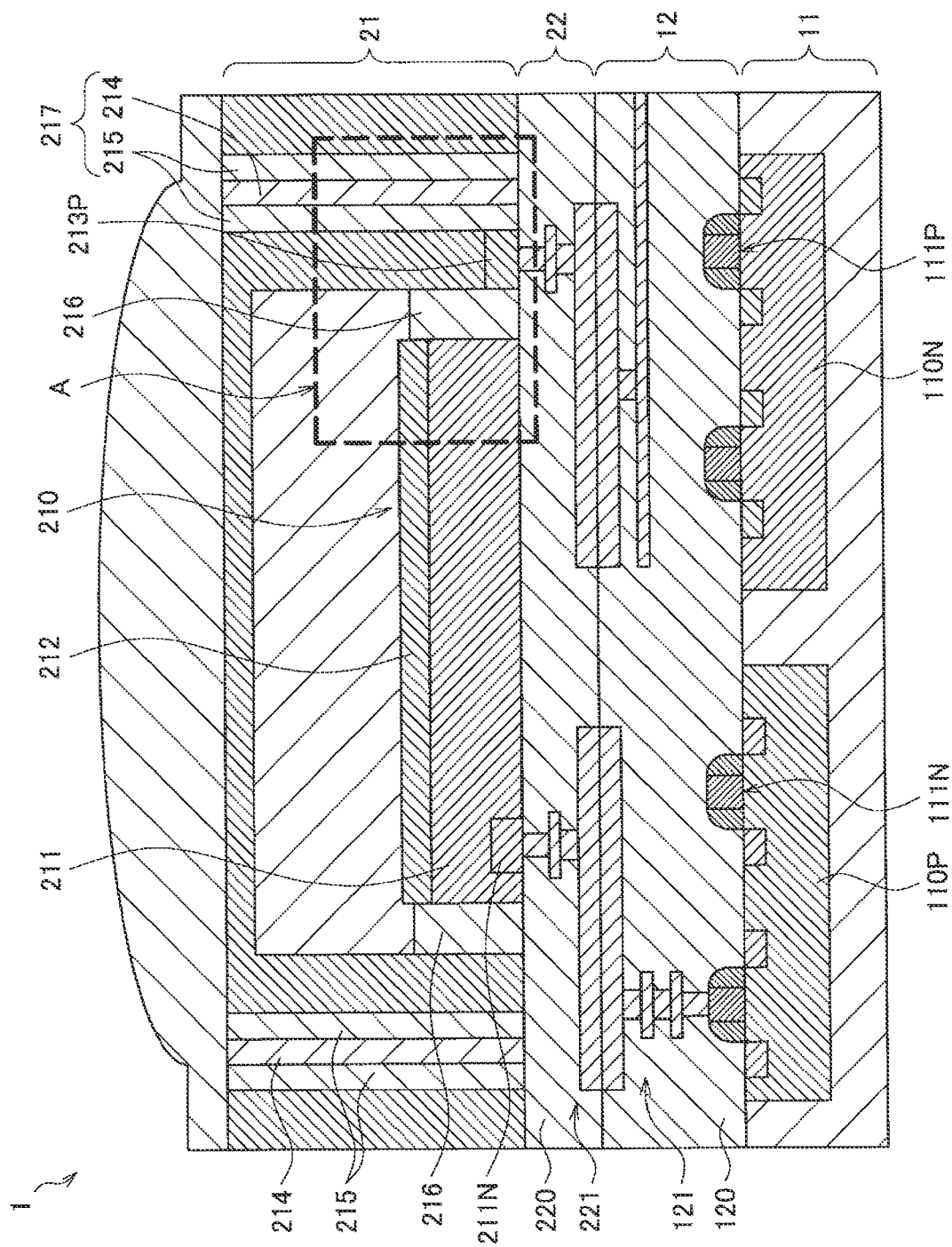
FIG. 1 is a vertical cross-sectional view illustrating a configuration of a photodetector according to an embodiment of the present disclosure.

Hereinafter, preferred embodiments of the present disclosure will be described in detail with reference to the accompanying drawings. In the present description and the drawings, components having substantially the same functional configuration are designated by the same reference numerals, so that duplicate description will be omitted.

In each of the drawings referred to in the following description, the sizes of some constituent members may be exaggerated for convenience of description. Therefore, the relative size of the constituent members shown in each drawing does not necessarily accurately represent the magnitude relationship between the actual constituent members.

The description shall be given in the following order.
1. Photodetector
1.1. Configuration of photodetector
1.2. Planar arrangement of insulating region
2. Modification examples
2.1. First modification example
2.2. Second modification example
2.3. Third modification example

1. Photodetector

1.1. Configuration of Photodetector

First, the configuration of the photodetector according to an embodiment of the present disclosure will be described with reference to FIGS. 1, 2A, and 2B. FIG. 1 is a vertical cross-sectional view illustrating the configuration of the photodetector according to the present embodiment.

The photodetector according to the present embodiment is a device that performs, in a high-electric-field pn junction region, avalanche multiplication of carriers generated by photoelectric conversion. The photodetector according to the present embodiment may be a so-called single photon avalanche photodiode (SPAD).

In the photodetector according to the present embodiment, for example, a pixel array can be formed by arranging a plurality of photodetectors in a matrix. With the pixel array using the photodetector according to the present embodiment, the light from an object can be detected with higher sensitivity and higher accuracy.

As shown in FIG. 1, a photodetector 1 according to the present embodiment can be configured, for example, as a layered semiconductor device in which a first substrate, in which a first semiconductor substrate 11 and a first wiring layer 12 are layered, and a second substrate, in which a second semiconductor substrate 21 and a second wiring layer 22 are layered, are bonded together.

In the photodetector 1, a microlens 33 is provided on the surface of the second substrate opposite to the surface on which the second wiring layer 22 is laminated. The incident light collected by the microlens 33 is converted into a signal charge by photoelectric conversion by a high-electric-field pn junction provided inside the second semiconductor substrate 21. The converted signal charge is transmitted to the first semiconductor substrate 11 via the second wiring layer 22 and the first wiring layer 12, and is converted into a detection signal corresponding to the incident light by a logic circuit provided on the first semiconductor substrate 11. By such an operation, the photodetector 1 can detect the incident light and output a detection signal corresponding to the detected incident light. The photodetector 1 according to the present embodiment may be used in a so-called back-illuminated layered imaging sensor.

The first semiconductor substrate 11 is, for example, a silicon (Si) substrate. However, the first semiconductor substrate 11 may be a substrate formed of an elemental semiconductor other than silicon or a compound semiconductor. The first semiconductor substrate 11 may be doped at a low concentration with a p-type impurity such as boron (B) and aluminum (Al), or an n-type impurity such as phosphorus (P) and arsenic (As).

The first semiconductor substrate 11 is provided with a p-type region (p-well) 110P doped at a high concentration with a p-type impurity and an n-type region (n-well) 110N doped at a high concentration with an n-type impurity. However, where the first semiconductor substrate 11 is doped, the doping concentration of the p-type region 110P and the n-type region 110N is set to be higher than the doping concentration of the first semiconductor substrate 11.

For example, an n-type field effect transistor (FET) 111N is provided in the p-type region 110P, and a p-type field effect transistor (FET) 111P is provided in the n-type region 110N. That is, CMOS (complementary MOS) using the n-type FET 111N and the p-type FET 111P are formed on the first semiconductor substrate 11. As a result, a logic circuit for signal processing the signal charge photoelectrically converted by the second semiconductor substrate 21 can be formed on the first semiconductor substrate 11.

The first wiring layer 12 is provided by layering wirings 121 that transmit a current or a voltage between a plurality of circuits or elements, and an interlayer insulating film 120 that insulates the wirings 121 from each other. The wiring 121 can electrically connect the terminals of the n-type FET 111N and the p-type FET 111P, which are provided on the first semiconductor substrate 11, by electrical connection by contacts penetrating the interlayer insulating film 120 in the thickness direction of the first wiring layer 12.

The wiring 121 and contacts can be formed of, for example, a conductive material a metal such as titanium (Ti), molybdenum (Mo), tantalum (Ta), tungsten (W), niobium (Nb), nickel (Ni), zirconium (Zr), gold (Au), silver (Ag), aluminum (Al), and copper (Cu), or an alloy or a metal compound thereof. The interlayer insulating film 120 can be formed of, for example, an insulating inorganic oxynitride such as silicon dioxide ($SiO_2$), silicon nitride (SiN), and silicon oxynitride (SiON).

Similar to the first wiring layer 12, the second wiring layer 22 is provided by layering wirings 221 that transmit a current or a voltage between a plurality of circuits or elements, and an interlayer insulating film 220 that insulates the wirings 221 from each other. The wiring 221 can transmit the signal charge photoelectrically converted by the pn junction inside the second semiconductor substrate 21 to the first wiring layer 12 by electrical connection by contacts penetrating the interlayer insulating film 220 in the thickness direction of the second wiring layer 22.

The wiring 221 and contacts can be formed of, for example, a conductive material such as a metal such as titanium (Ti), molybdenum (Mo), tantalum (Ta), tungsten (W), niobium (Nb), nickel (Ni), zirconium (Zr), gold (Au), silver (Ag), aluminum (Al), and copper (Cu), or an alloy or a metal compound thereof. The interlayer insulating film 220 can be formed of, for example, an insulating inorganic oxynitride such as silicon dioxide ($SiO_2$), silicon nitride (SiN), and silicon oxynitride (SiON).

Here, the first substrate and the second substrate are bonded so that the first wiring layer 12 and the second wiring layer 22 face each other. The wiring 121 included in the first wiring layer 12 and the wiring 221 included in the second wiring layer 22 can be electrically connected by joining the electrodes exposed on the surfaces of the first wiring layer 12 and the second wiring layer 22 to each other.

Specifically, the electrodes are formed on the uppermost layers of the first wiring layer 12 and the second wiring layer 22, respectively. Therefore, the electrodes can be joined to each other by bonding the first wiring layer 12 and the second wiring layer 22 together so that the layers face each other, bringing the electrodes into direct contact with each other, and performing heat treatment. With such an electrode joined structure, in the photodetector 1, the wiring 121 of the first wiring layer 12 and the wiring 221 of the second wiring layer 22 can be electrically connected without forming a contact penetrating the interface between the first wiring layer 12 and the second wiring layer 22. With such an electrode joined structure, the manufacturing process of the photodetector 1 can be simplified.

The second semiconductor substrate 21 is, for example, a silicon (Si) substrate. However, the second semiconductor substrate 21 may be a substrate formed of an elemental semiconductor other than silicon or a compound semiconductor. The second semiconductor substrate 21 may be doped at a low concentration with a p-type impurity such as boron (B) and aluminum (Al), or an n-type impurity such as phosphorus (P) and arsenic (As).

The second semiconductor substrate 21 is provided with a first conductivity type region 211 doped at a high concentration with an impurity of a first conductivity type (for example, n-type), and a second conductivity type region 212 doped at a high concentration with an impurity of a second conductivity type (for example, p-type). Specifically, the first conductivity type region 211 is provided on the surface side of the second semiconductor substrate 21 on which the second wiring layer 22 is layered, and the second conductivity type region 212 is provided on the inner side of the second semiconductor substrate 21 with respect to the first conductivity type region 211 so as to be in contact with the first conductivity type region 211.

The second conductivity type region 212 forms a pn junction at the interface with the first conductivity type region 211, and the carriers generated by the incident light are multiplied by the avalanche process. For example, the second conductivity type region 212 may be depleted in order to increase the detection efficiency (Photon Detection Efficiency: PDE) of the photodetector 1. In this description, the first conductivity type region 211 and the second conductivity type region 212 are also collectively referred to as a multiplication region 210.

Where the second semiconductor substrate 21 is doped, the region of the second semiconductor substrate 21 further on the inner side with respect to the second conductivity type region 212 can be depleted, so that the detection efficiency (PDE) of the photodetector 1 can be further increased. The doping concentration of the second semiconductor substrate 21 at this time may be lower than the doping concentration of the second conductivity type region 212.

The first conductivity type region 211 functions as a cathode for extracting avalanche-multiplied carriers (for example, holes) in the second conductivity type region 212. The first conductivity type region 211 may be electrically connected to the wiring 221 of the second wiring layer 22 via a contact in a contact region 211N doped with an impurity of a first conductivity type (for example, n-type) having a higher concentration.

Meanwhile, an anode 213P for extracting the avalanche-multiplied carriers (for example, electrons) in the second conductivity type region 212 is provided in the second semiconductor substrate 21 in the same layer as the first conductivity type region 211 and between a separation region 217 described hereinbelow and the first conductivity type region 211. The anode 213P is doped with, for example, an impurity of a second conductivity type (for example, p-type) having a higher concentration than a hole accumulation region 213 described hereinbelow, and is electrically connected to the wiring 221 of the second wiring layer 22 via a contact.

The second conductivity type region 212 may be provided in the projection region of the first conductivity type region 211 when the surface of the second semiconductor substrate 21 is viewed in a plan view. That is, the second conductivity type region 212 may be provided in a planar shape somewhat smaller than the first conductivity type region 211. In the vicinity of the separation region 217 that defines a pixel region, carriers that do not depend on photoelectric conversion are likely to occur. Therefore, by making the planar shape of the second conductivity type region 212 somewhat smaller than the planar shape of the first conductivity type region 211, the possibility that the carriers that do not depend on photoelectric conversion will be avalanche-multiplied in the second conductivity type region 212 can be reduced. Accordingly, the generation of a noise signal in the photodetector 1 can be suppressed.

The second semiconductor substrate 21 is further provided with a separation region 217 for determining the pixel region of the photodetector 1. Specifically, the separation region 217 is provided so as to planarly surround the first conductivity type region 211 and the second conductivity type region 212, which are multiplication regions 210. The separation region 217 can prevent electrical crosstalk between pixels by electrically insulating the multiplication region 210 for each pixel. Accordingly, a pixel array can be formed by arranging a plurality of photodetectors 1 in a matrix.

The separation region 217 can be configured of, for example, a metal film 214 that penetrates the second semiconductor substrate 21 in the thickness direction and an insulating film 215 that covers the side surface of the metal film 214. The metal film 214 can be formed of, for example, a metal (for example, tungsten) that reflects light. The insulating film 215 can be formed of, for example, an inorganic oxynitride (for example, $SiO_2$ and the like) having insulating properties. Accordingly, in the separation region 217, the pixels can be optically separated by the metal film 214, and the pixels can be electrically separated by the insulating film 215.

The second semiconductor substrate 21 is further provided with a hole accumulation region 213 in which holes are accumulated as a result of doping with an impurity of a second conductivity type (for example, p-type). Specifically, the hole accumulation region 213 is provided in the second semiconductor substrate 21 in the pixel region along the side surface of the separation region 217. Further, the hole accumulation region 213 may be provided to extend to a surface opposite to the surface of the second substrate on which the second wiring layer 22 is layered. The hole accumulation region 213 is provided in a region where different materials are in contact with each other to suppress a dark current generated at an interface between the different materials.

Further, the hole accumulation region 213 may be in contact with the anode 213P. Specifically, the anode 213P may be in contact with the hole accumulation region 213 by being provided in a partial region of the surface of the second semiconductor substrate 21 within the hole accumulation region 213 provided along the side surface of the separation region 217. Accordingly, in the photodetector 1, the bias voltage applied to the multiplication region 210 via the anode 213P and the hole accumulation region 213 can be adjusted. Further, the hole accumulation region 213 functions as a path for extracting carriers (for example, electrons) from the inside of the second semiconductor substrate 21 to the anode 213P, so that the on-resistance of the photodetector 1 can be reduced.

In the photodetector 1 according to the present embodiment, an insulating region 216 is further provided in the second semiconductor substrate 21 between the first conductivity type region 211, which is a cathode, and the anode 213P.

Here, the configuration of the insulating region 216 will be specifically described with reference to FIGS. 2A and 2B. FIG. 2A is a vertical view obtained by rotating the enlarged region A of FIG. 1 by 180°. FIG. 2B is a vertical cross-sectional view showing a modification example of the structure shown in FIG. 2A.

Figure 2A:
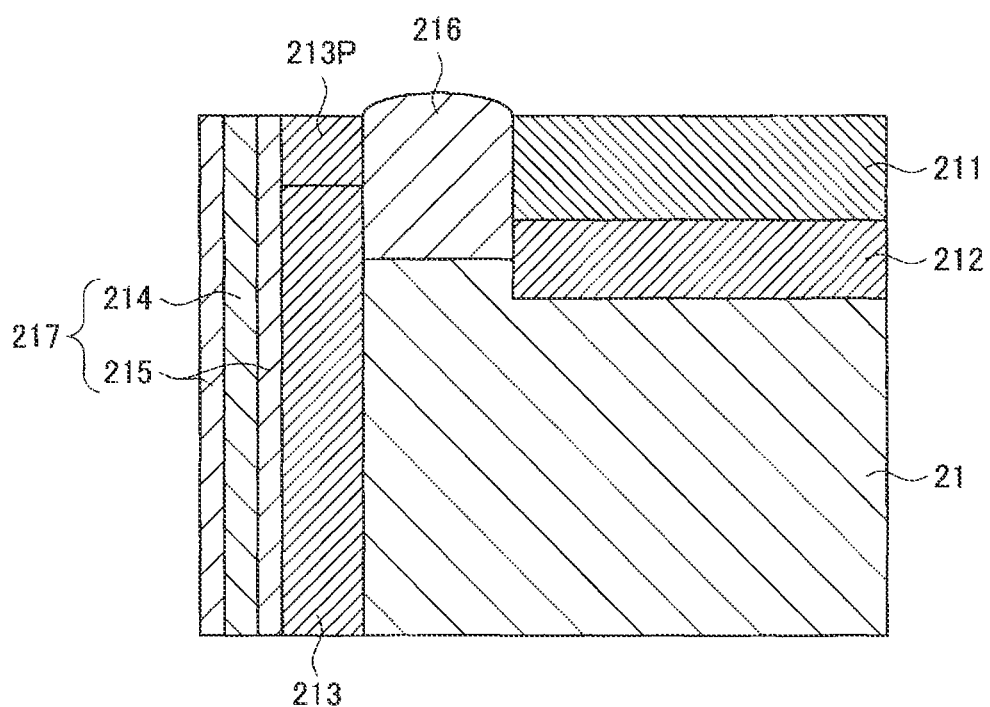
FIG. 2A is an enlarged vertical cross-sectional view of the region A in FIG. 1 rotated by 180°.
Figure 2B:
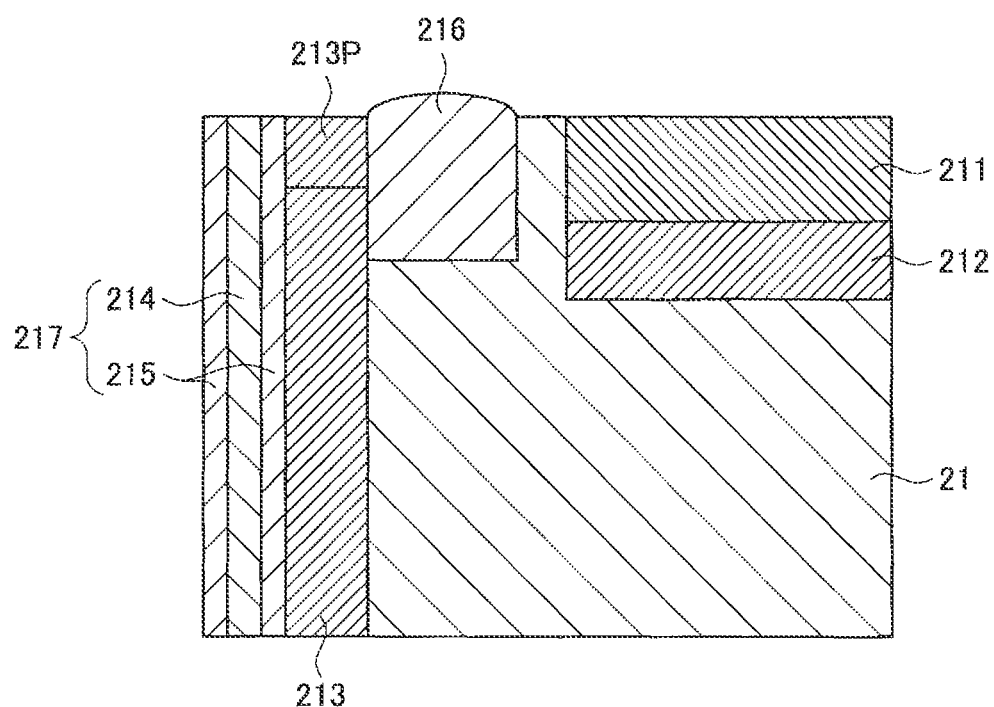
FIG. 2B is a vertical cross-sectional view showing a modification example of the structure shown in FIG. 2A.

As shown in FIG. 2A, the insulating region 216 is configured of an insulating material and is provided in the second semiconductor substrate 21 between the first conductivity type region 211, which is a cathode, and the anode 213P. Accordingly, the insulating region 216 can reduce the possibility of edge breakdown by relaxing the electric field between the first conductivity type region 211 and the anode 213P.

The insulating region 216 is provided at a formation depth deeper than the formation depth of the first conductivity type region 211. Accordingly, the insulating region 216 can further enhance the electric field relaxation effect between the first conductivity type region 211 and the anode 213P.

Meanwhile, the insulating region 216 may be provided at a formation depth shallower than the formation depth of the second conductivity type region 212. Accordingly, with the insulating region 216, the carriers (holes) that are not dependent on photoelectric conversion and were generated at the interface between the second semiconductor substrate 21 and the insulating region 216, which are configured of different materials, can be collected in the first conductivity type region 211 without entering the second conductivity type region 212. Therefore, in the photodetector 1, the probability that the carriers that do not depend on photoelectric conversion will be avalanche-multiplied in the second conductivity type region 212 can be reduced, so that the noise signal can be further reduced. The carriers (electrons) that do not depend on photoelectric conversion and were generated at the interface between the second semiconductor substrate 21 and the insulating region 216 are collected in, for example, the hole accumulation region 213 adjacent to the insulating region 216.

The insulating region 216 can be formed of, for example, an insulating inorganic oxynitride such as silicon dioxide ($SiO_2$), silicon nitride (SiN), and silicon oxynitride (SiON). Specifically, the insulating region 216 may be formed by using an STI (Shallow Trench Isolation) method to remove a part of a predetermined region of the second semiconductor substrate 21 by etching or the like, and then filling the formed opening with silicon oxide ($SiO_2$).

The insulating region 216 may be present between the first conductivity type region 211, which is a cathode, and the anode 213P. Specifically, the insulating region 216 may not be in contact with the first conductivity type region 211 and may not be in contact with the anode 213P. For example, as shown in FIG. 2B, the insulating region 216 may be provided at a distance from the first conductivity type region 211. When the insulating region 216 and the first conductivity type region 211 are separated from each other, the electric field concentration can be prevented between the insulating region 216 and the first conductivity type region 211, so that the probability of the edge breakdown in the photodetector 1 can be reduced.

Meanwhile, when the insulating region 216 is provided in contact with the first conductivity type region 211, as shown in FIG. 2A, the size of the pixel region in the photodetector 1 can be further reduced, so that the pixel array using the photodetector 1 can be made finer and denser.

1.2. Planar Arrangement of Insulating Region

Figure 3:
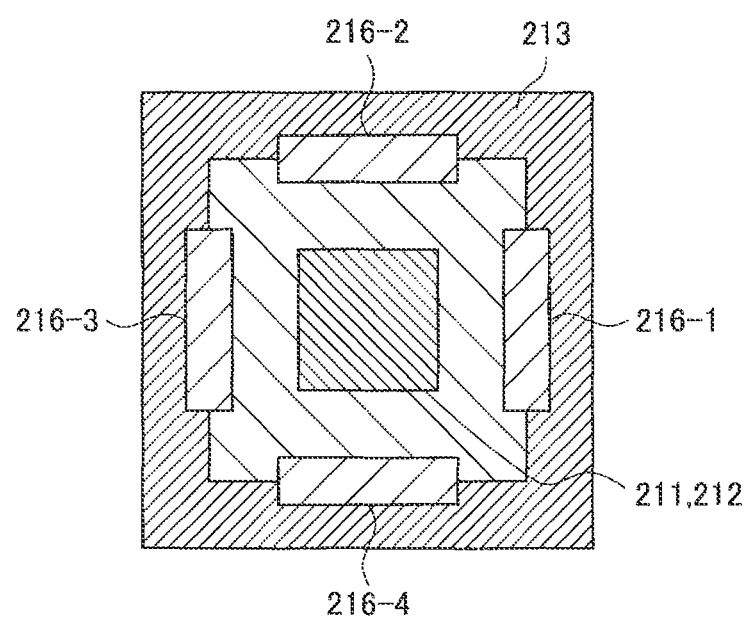
FIG. 3 is a plan view showing a first planar arrangement example of an insulating region.
Figure 4:
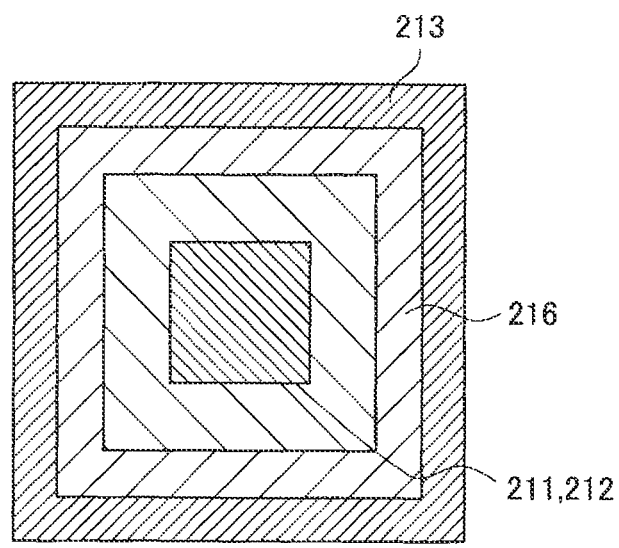
FIG. 4 is a plan view showing a second planar arrangement example of the insulating region.

Next, the planar arrangement of the insulating region 216 will be specifically described with reference to FIGS. 3 and 4. FIG. 3 is a plan view showing a first planar arrangement example of the insulating region 216, and FIG. 4 is a plan view showing a second planar arrangement example of the insulating region 216. In the plan views shown in FIGS. 3 and 4, the case where the insulating region 216 and the first conductivity type region 211 are provided apart from each other (example shown in FIG. 2B) will be illustrated for easy understanding.

Hereinafter, the case where the pixel region defined by the separation region 217 has a quadrangular shape will be described as an example, but the shape of the pixel region defined by the separation region 217 is not limited to such an example. The shape of the pixel region may be a polygonal shape, and may be a triangle, a pentagon, a hexagon, or a polygonal shape other than a quadrangle.

In the first planar arrangement example, the pixel region defined by the separation region 217 has a polygonal shape, and a plurality of regions of the insulating region 216 is provided at positions corresponding to each side of the polygonal shape of the pixel region. Specifically, as shown in FIG. 3, the pixel region having the hole accumulation region 213 as the outer circumference has a quadrangular shape, and the insulating region 216 may be configured of a plurality of regions 216-1, 216-2, 216-3, and 216-4 separated from each other. The regions 216-1, 216-2, 216-3 and 216-4 are provided at positions corresponding to each side of the polygonal shape of the pixel region.

In the planar arrangement example shown in FIG. 3, since the insulating region 216 is divided into a plurality of regions 216-1, 216-2, 216-3, and 216-4, a planar route is ensured by which the carriers that do not depend on photoelectric conversion escape to the hole accumulation region 213. Therefore, with the first planar arrangement example, the possibility that the carriers that do not depend on photoelectric conversion will enter the second conductivity type region 212 where avalanche multiplication is performed can be further reduced, so that a noise signal in the photodetector 1 can be suppressed.

In the planar arrangement example shown in FIG. 3, the positions where the plurality of regions 216-1, 216-2, 216-3, and 216-4 constituting the insulating region 216 are separated from each other correspond to the vertices of the quadrangular shape. This is because at the position corresponding to each vertex of the quadrangular shape, the distance between the first conductivity type region 211 and the hole accumulation region 213 is larger than at the position corresponding to each side of the quadrangular shape, so that the possibility of edge breakdown is sufficiently low although the insulating region 216 is not provided.

Therefore, according to the first planar arrangement example, the insulating region 216 can suppress the generation of noise signals while effectively suppressing the edge breakdown.

In the second planar arrangement example, the pixel region defined by the separation region 217 has a polygonal shape, and the insulating region 216 is provided over the entire circumference of the polygonal shape of the pixel region. Specifically, as shown in FIG. 4, the pixel region having the hole accumulation region 213 as the outer circumference has a quadrangular shape, and the insulating region 216 may be provided along the entire circumference of the pixel region along the hole accumulation region 213.

In the planar arrangement example shown in FIG. 4, since the insulating region 216 is provided isotropically and continuously, it is possible to suppress the variation in the characteristics of the insulating region 216 for each orientation. Further, since the formed region is isotropic and continuous, the insulating region 216 can be formed by a simpler manufacturing process.

Subsequently, a modification example of the second planar arrangement example will be explained with reference to FIGS. 5A, 5B, 5C, 5D, 5E, and 5F. FIGS. 5A to 5F are plan views showing a modification example of the second planar arrangement example of the insulating region 216. In the plan views shown in 5A, 5B, 5C, 5D, 5E, and 5F, the case where the insulating region 216 and the first conductivity type region 211 are provided apart from each other (example shown in FIG. 2B) will also be illustrated for easy understanding.

Figure 5A:
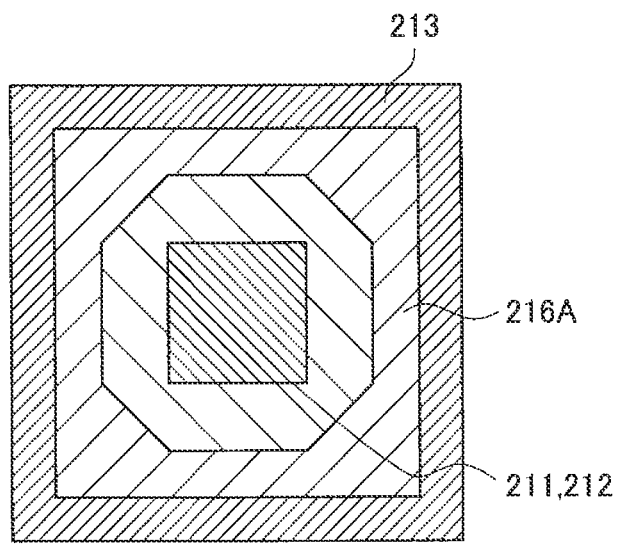
FIG. 5A is a plan view showing a modification example of the second planar arrangement example of the insulating region.

As shown in FIG. 5A, an insulating region 216A can be provided so that the width at the position corresponding to each vertex of the quadrangular shape of the pixel region is larger than the width at the position corresponding to each side of the quadrangular shape. Specifically, the insulating region 216A may have a planar shape that spreads out from a planar shape provided over the entire circumference of the quadrangular shape of the pixel region to line segments diagonally spanned between two sides constituting each vertex of the quadrangular shape. In other words, the insulating region 216A may have a planar shape that spreads out from a planar shape provided over the entire circumference of the quadrangular shape of the pixel region in a triangular shape at a position corresponding to each vertex of the quadrangular shape.

Figure 5B:
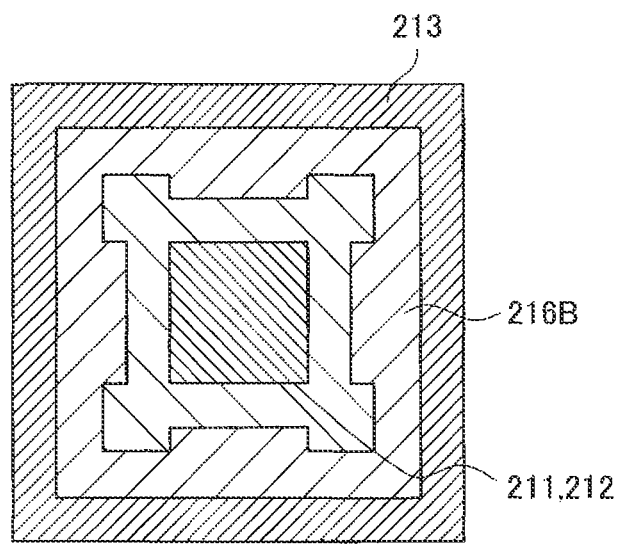
FIG. 5B is a plan view showing a modification example of the second planar arrangement example of the insulating region.

Further, as shown in FIG. 5B, an insulating region 216B can be provided so that the width at the position corresponding to each side of the quadrangular shape of the pixel region is larger than the width at the position corresponding to each vertex of the quadrangular shape. Specifically, the insulating region 216B may have a planar shape that spreads out from a planar shape provided over the entire circumference of the quadrangular shape of the pixel region as a quadrangle at a position corresponding to each side of the quadrangular shape.

With such a planar arrangement, the insulating region 216B can guide the carriers photoelectrically converted inside the second semiconductor substrate 21 to the second conductivity type region 212 where avalanche multiplication is to be performed. Specifically, the insulating region 216B closes the surface of the second semiconductor substrate 21 so that the carriers photoelectrically converted inside the second semiconductor substrate 21 do not enter the second conductivity type region 212 and can be prevented from reaching the surface of the second semiconductor substrate 21.

Figure 5C:
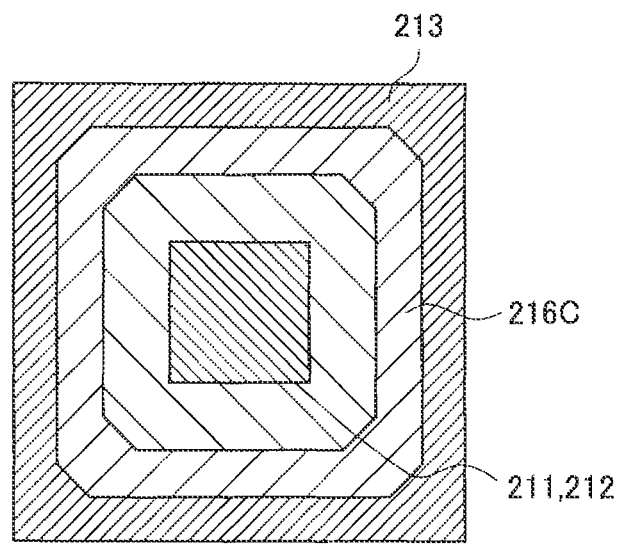
FIG. 5C is a plan view showing a modification example of the second planar arrangement example of the insulating region.
Figure 5D:
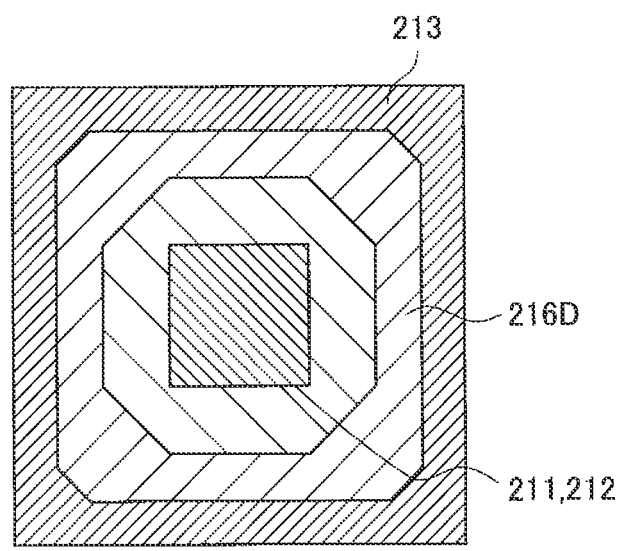
FIG. 5D is a plan view showing a modification example of the second planar arrangement example of the insulating region.
Figure 5E:
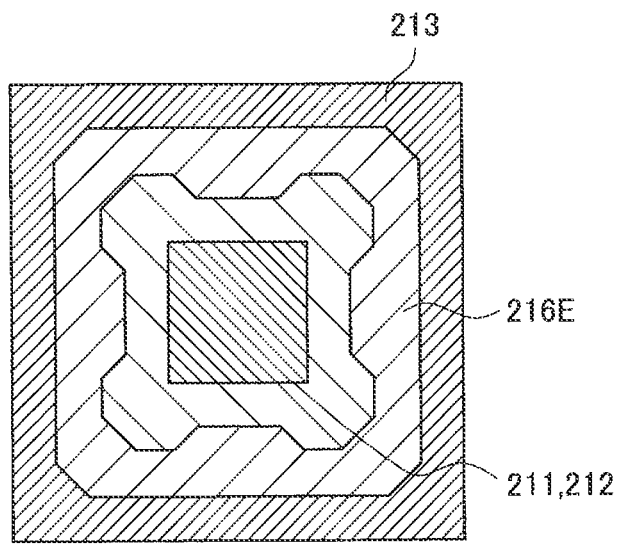
FIG. 5E is a plan view showing a modification example of the second planar arrangement example of the insulating region.

Further, as shown in FIGS. 5C, 5D, and 5E, the insulating regions 216C to 216E may be provided so that the angle of each vertex of the planar shape is larger than 90 degrees. Specifically, the insulating region 216C shown in FIG. 5C has a polygonal shape in which each vertex is diagonally cut from the polygonal shape of the insulating region 216 shown in FIGS. 5A, 5B, 5C, 5D, 5E, and 5F. Further, the insulating region 216D shown in FIG. 5D has a polygonal shape in which each vertex is diagonally cut from the polygonal shape of the insulating region 216A shown in FIG. 5A. Furthermore, the insulating region 216E shown in FIG. 5E has a polygonal shape in which each vertex is diagonally cut from the polygonal shape of the insulating region 216B shown in FIG. 5B.

With such a planar arrangement, the insulating regions 216C to 216E can suppress the concentration of stress at each vertex by setting the angle of each vertex of the planar shape to an obtuse angle of more than 90 degrees. Therefore, the insulating regions 216C to 216E can prevent the occurrence of defects inside the second semiconductor substrate 21. Accordingly, in the photodetector 1, the generation of carriers and the increase in dark current due to the defects can be suppressed.

Figure 5F:
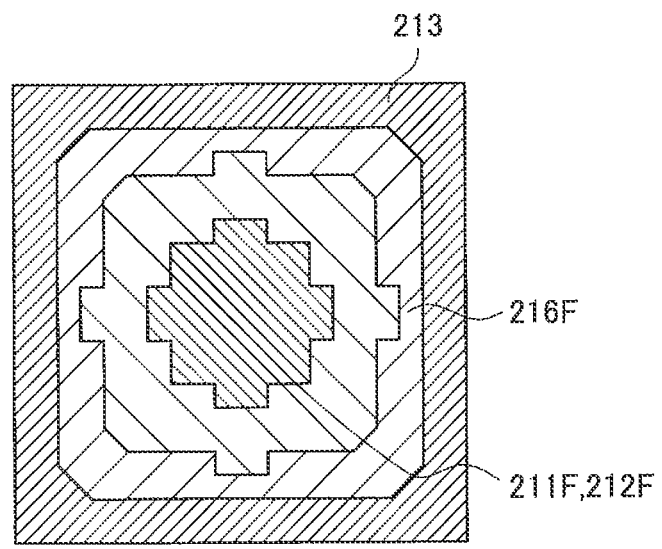
FIG. 5F is a plan view showing a modification example of the second planar arrangement example of the insulating region.

Further, as shown in FIG. 5F, the planar shapes of the first conductivity type region 211F and the second conductivity type region 212F are not limited to the quadrangular shape, and may be a triangular shape, a polygonal shape having five of more vertexes, or a concavo-convex polygonal shape. In such a case, the planar shape of the insulating region 216F can be changed according to the planar shapes of the first conductivity type region 211F and the second conductivity type region 212F. For example, the insulating region 216F may have a planar shape that becomes convex according to the convex shape of the planar shape of the first conductivity type region 211F and the second conductivity type region 212F, and may have a planar shape that becomes concave according to the convex shape of the planar shape of the first conductivity type region 211F and the second conductivity type region 212F. Conversely, the insulating region 216F may have a planar shape that becomes convex according to the concave shape of the planar shape of the first conductivity type region 211F and the second conductivity type region 212F, and may have a planar shape that becomes concave according to the concave shape of the planar shape of the first conductivity type region 211F and the second conductivity type region 212F.

In the above, the photodetector 1 according to the present embodiment has been specifically described. In the photodetector 1 according to the present embodiment, the insulating region 216 relaxes the electric field between the first conductivity type region 211, which is the cathode, and the anode 213P and can reduce the possibility of edge breakdown. Since the insulating region 216 is highly effective in electric field relaxation and can effectively reduce the possibility of edge breakdown over shorter distances, the size of the pixel region in the photodetector 1 can be further reduced. Accordingly, the photodetector 1 makes it possible to further miniaturize and increase the density of the pixel array using the photodetector 1.

The photodetector 1 according to the present embodiment can be manufactured by using a technique and a process known as a method for manufacturing a semiconductor device, and an apparatus therefor. The description of the details of the manufacturing method of the photodetector 1 according to the present embodiment is omitted.

2. Modification Examples

Next, first to third modification examples of the photodetector 1 according to the present embodiment will be described with reference to FIGS. 6, 7A, 7B, 8, 9A, 9B, and 9C.

2.1. First Modification Example

Figure 6:
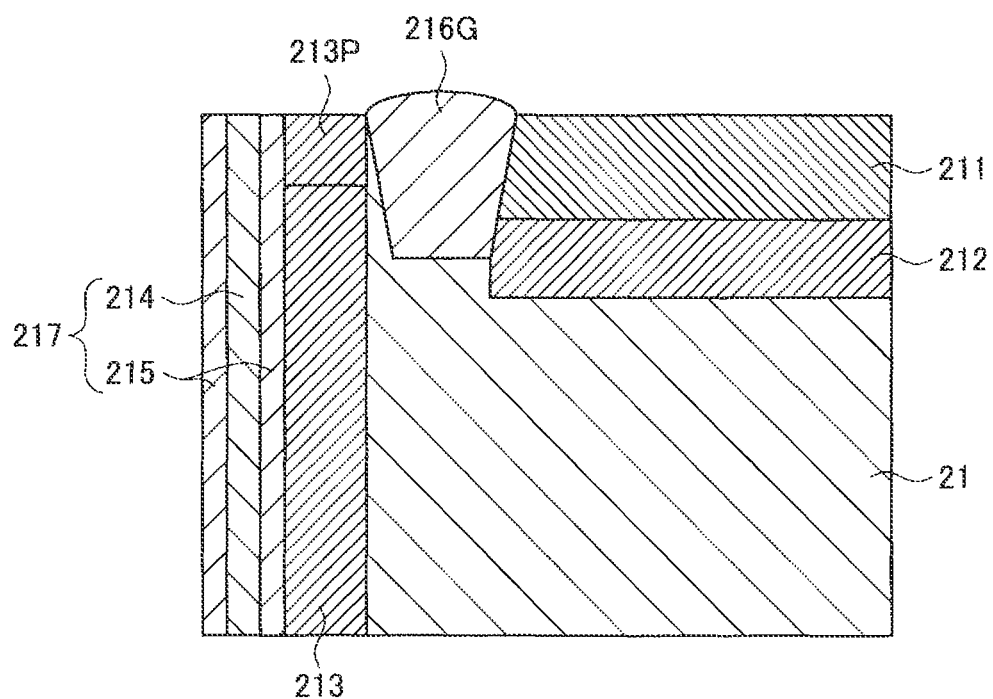
FIG. 6 is a vertical cross-sectional view corresponding to FIG. 2A and showing a cross-sectional shape of the insulating region according to a first modification example.

First, a first modification example of the photodetector 1 according to the present embodiment will be described with reference to FIG. 6. FIG. 6 is a vertical cross-sectional view corresponding to FIG. 2A and showing the cross-sectional shape of the insulating region 216G according to the first modification example.

As shown in FIG. 2A, the three-dimensional shape of the insulating region 216G may be a shape that is reversely tapered in the thickness direction of the second semiconductor substrate 21. Specifically, the three-dimensional shape of the insulating region 216G may be a reverse taper shape in which the diameter of the planar shape gradually decreases from the surface of the second semiconductor substrate 21 toward the inside. Since such a three-dimensionally shaped insulating region 216G can suppress the concentration of stress in the thickness direction of the second semiconductor substrate 21, it is possible to prevent the occurrence of defects inside the second semiconductor substrate 21. Accordingly, in the photodetector 1, the generation of carriers and the increase in dark current due to the defects in the second semiconductor substrate 21 can be suppressed.

The three-dimensional inverted taper shape of the insulating region 216G can be also applied to the above-described insulating regions 216 and 216A to 216F having a planar shape shown in FIGS. 3, 4, 5A, 5B, 5C, 5D, 5E, and 5F.

2.2. Second Modification Example

Figure 7A:
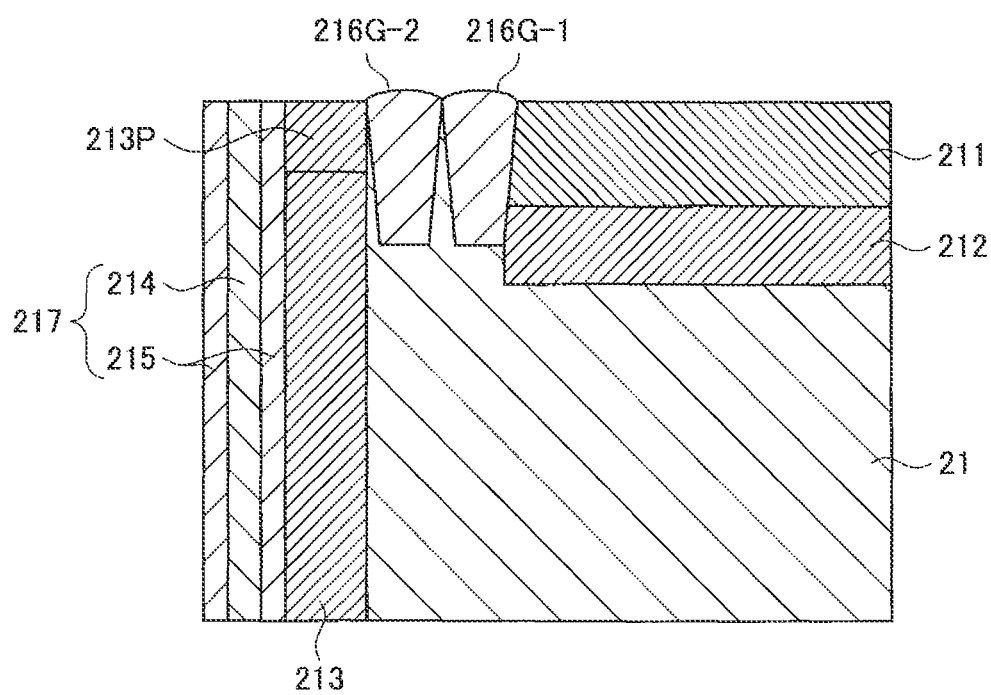
FIG. 7A is a vertical cross-sectional view corresponding to FIG. 2A and showing a cross-sectional shape of the insulating region according to a second modification example.
Figure 7B:
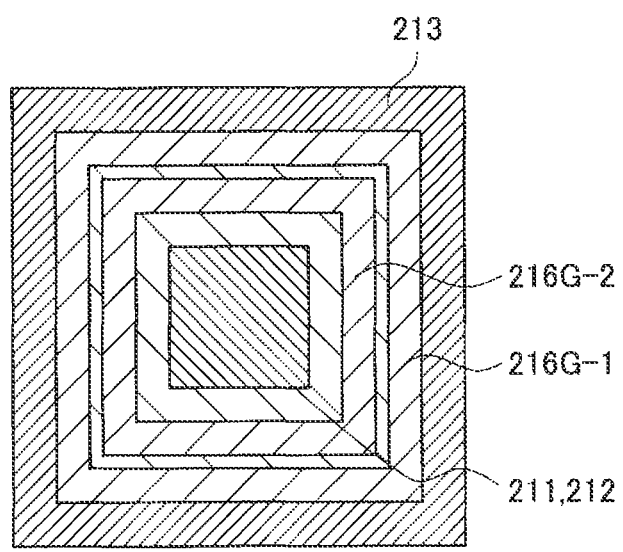
FIG. 7B is a vertical cross-sectional view corresponding to FIG. 3 and showing a cross-sectional shape of the insulating region according to the second modification example.

Next, a second modification of the photodetector 1 according to the present embodiment will be described with reference to FIGS. 7A and 7B. FIG. 7A is a vertical cross-sectional view corresponding to FIG. 2A and showing the insulating region 216G-1 and 216G-2 according to the second modification example. FIG. 7B is a plan view corresponding to FIG. 3 and showing the planar shape of the insulating regions 216G-1 and 216G-2 according to the second modification example.

As shown in FIG. 7A, a plurality of insulating regions 216G-1 and 216G-2 may be provided side by side between the first conductivity type region 211, which is a cathode, the anode 213P, and the hole accumulation region 213. Specifically, as shown in FIG. 7B, the insulating region 216G-2 may be provided over the entire circumference of the polygonal shape of the pixel region, and the insulating region 216G-1 may be provided over the entire circumference inside the insulating region 216G-2. That is, the insulating regions 216G-1 and 216G-2 may be provided in a multi-ring shape.

By providing a plurality of insulating regions 216G-1 and 216G-2 in the direction from the center of the pixel region to the outside, it is possible to relax an electric field between the first conductivity type region 211, which is a cathode, and the anode 213P to a greater extent. Accordingly, in the photodetector 1, the possibility of edge breakdown can be further reduced. Further, the insulating regions 216G-1 and 216G-2 can extend the optical path length of light from the second wiring layer 22 side (for example, the reflected light from the wiring 221) by a scattering effect and can reduce the possibility that the light from the second wiring layer 22 side will become noise, thereby making it possible to further improve the detection efficiency of the photodetector 1.

FIG. 7A shows an example in which the three-dimensional shape of the insulating regions 216G-1 and 216G-2 is an inverted tapered shape, but the present modification example is not limited to such an example. The three-dimensional shape of the insulating regions 216G-1 and 216G-2 may be a non-tapered shape such as shown in FIG. 2A. Further, FIG. 7B shows an example in which the insulating regions 216G-1 and 216G-2 are provided over the entire circumference of the polygonal shape of the pixel region, but the present modification example is not limited to such an example. The insulating regions 216G-1 and 216G-2 may be divided into a plurality of regions by being separated in the circumferential direction of the polygonal shape of the pixel region.

2.3. Third Modification Example

Figure 8:
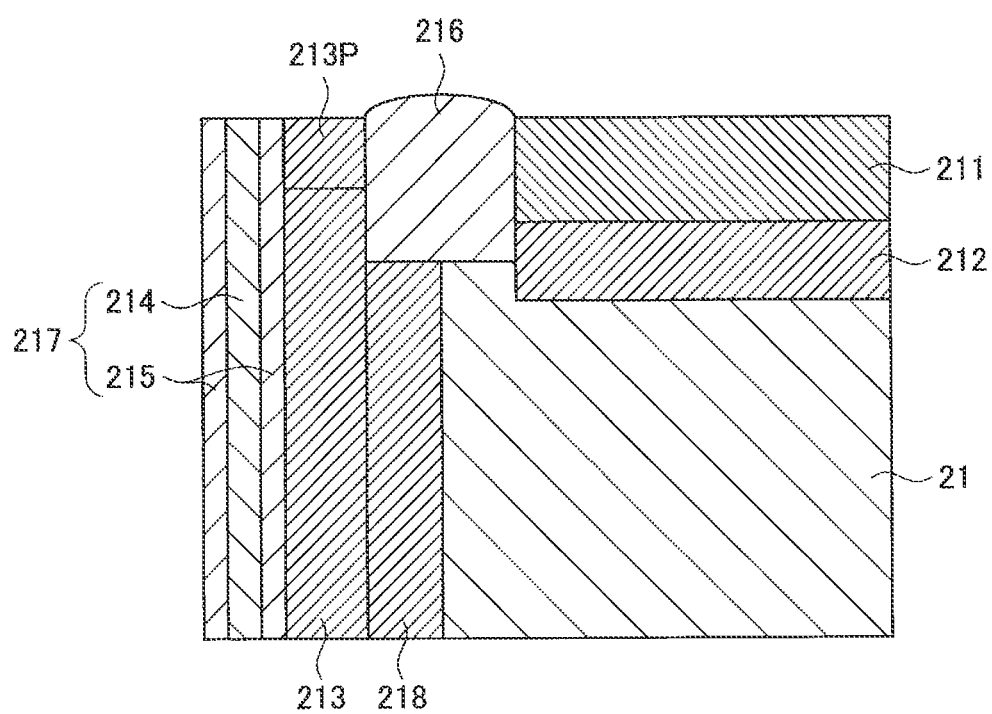
FIG. 8 is a vertical cross-sectional view corresponding to FIG. 2A and showing a cross section of the second semiconductor substrate according to a third modification example.
Figure 9A:
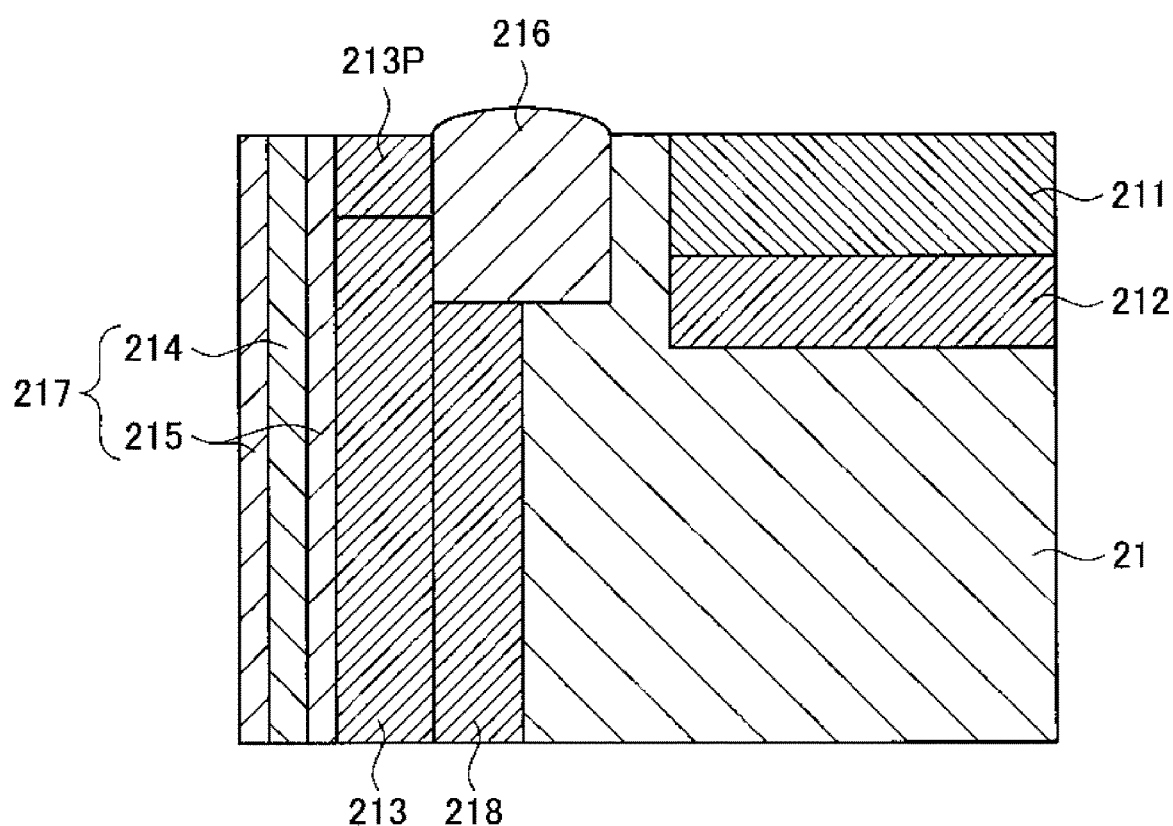
FIG. 9A is a vertical cross-sectional view showing a variation of the cross section of the second semiconductor substrate shown in FIG. 8.
Figure 9B:
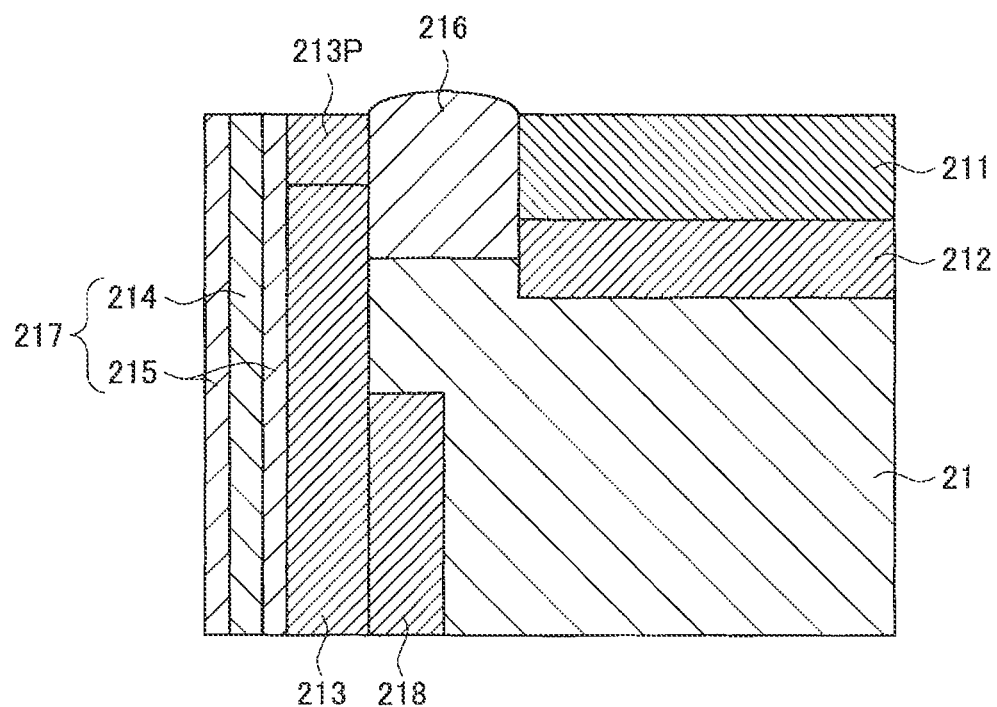
FIG. 9B is a vertical cross-sectional view showing a variation of the cross section of the second semiconductor substrate shown in FIG. 8.
Figure 9C:
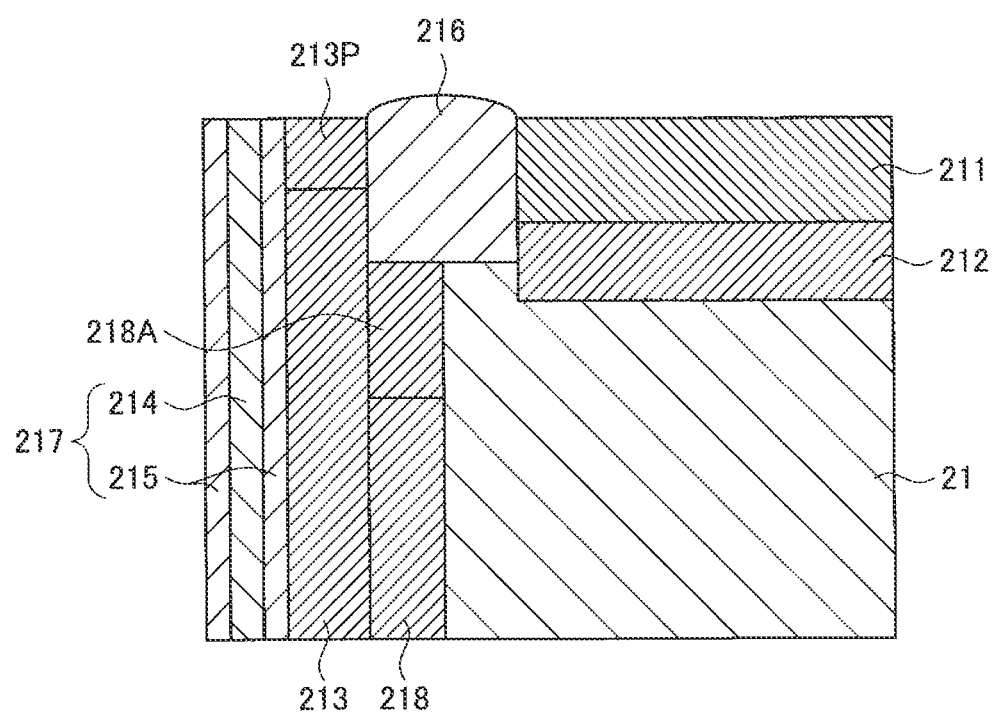
FIG. 9C is a vertical cross-sectional view showing a variation of the cross section of the second semiconductor substrate shown in FIG. 8.

Further, the third modification example of the photodetector 1 according to the present embodiment will be described with reference to FIGS. 8, 9A, 9B, and 9C. FIG. 8 is a vertical cross-sectional view corresponding to FIG. 2A and showing a cross section of the second semiconductor substrate 21 according to the third modification example. FIGS. 9A, 9B, and 9C are vertical cross-sectional views showing variations in the cross section of the second semiconductor substrate 21 shown in FIG. 8.

As shown in FIG. 8, the second semiconductor substrate 21 on the inner side with respect to the insulating region 216 may be provided with a sub-accumulation region 218 of the same conductivity type (for example, p-type) as the hole accumulation region 213. Specifically, the sub-accumulation region 218 is doped with an impurity of a second conductivity type (for example, p-type), like the hole accumulation region 213, to accumulate holes and is provided in contact with the side surface of the hole accumulation region 213. The sub-accumulation region 218 supports the function of the hole accumulation region 213 as a path for extracting carriers (for example, electrons) from the inside of the second semiconductor substrate 21 to the anode 213P. Accordingly, the on-resistance of the photodetector 1 can be further reduced.

Further, in the sub-accumulation region 218, similarly to the hole accumulation region 213, carriers (for example, electrons) generated at the interface between the insulating region 216 and the second semiconductor substrate 21 can be collected. Accordingly, in the photodetector 1, the generation of noise signals due to carriers that do not depend on photoelectric conversion can be further reduced.

However, the sub-accumulation region 218 may be provided in the projection region of the insulating region 216 when the surface of the second semiconductor substrate 21 is viewed in a plan view. Where the sub-accumulation region 218 is excessively close to the first conductivity type region 211, unintended conduction may occur between the sub-accumulation region 218 and the first conductivity type region 211. Therefore, the sub-accumulation region 218 is provided so as not to protrude from the region where the insulating region 216 is provided.

For example, as in the insulating region 216A shown in FIG. 5A, it is possible to increase the region in which the sub-accumulation region 218 can be formed by increasing the planar region of the insulating region 216A. In the planar arrangement example shown in FIG. 5A, the planar region of the insulating region 216A is increased at positions where the distance between the first conductivity type region 211 and the hole accumulation region 213 is relatively large, those positions corresponding to the vertexes of the polygonal shape of the pixel region. Accordingly, the region where the sub-accumulation region 218 can be formed is made wider. Therefore, the on-resistance of the photodetector 1 can be further reduced.

The sub-accumulation region 218 may be provided in all the regions provided with the insulating region 216, or may be provided in a part of the region provided with the insulating region 216.

Here, as shown in FIGS. 9A, 9B, and 9C, in the third modification example, the first conductivity type region 211, the insulating region 216, and the sub-accumulation region 218 do not have to be in contact with each other. For example, as shown in FIG. 9A, the first conductivity type region 211 and the insulating region 216 may not be in contact with each other.

As shown in FIG. 9B, the insulating region 216 and the sub-accumulation region 218 may not be in contact with each other. In such a case, it is not necessary to study the manufacturing process conditions for strictly controlling the formation depth of the insulating region 216 and the formation depth of the sub-accumulation region 218, so that the production of the photodetector 1 can be facilitated.

Further, as shown in FIG. 9C, a low-concentration region 218A doped with an impurity of a second conductivity type (for example, p-type) similarly to the sub-accumulation region 218 and the hole accumulation region 213 may be further provided between the insulating region 216 and the sub-accumulation region 218 that are separated from each other. The low-concentration region 218A has the same function as the sub-accumulation region 218, but the doping concentration of the impurity of a second conductivity type (for example, p-type) is lower than the doping concentration of the sub-accumulation region 218. As a result of providing the low-concentration region 218A in the photodetector 1, it is possible to obtain the same effect as with the structure shown in FIG. 8 without strictly controlling the formation depth of the insulating region 216 and the formation depth of the sub-accumulation region 218. That is, the on-resistance of the photodetector 1 can be reduced.

Although preferred embodiments of the present disclosure have been described in detail with reference to the accompanying drawings, the technical scope of the present disclosure is not limited to such examples. It is clear that anyone with ordinary knowledge in the technical field of the present disclosure may come up with various changes and modifications within the scope of the technical ideas set forth in the claims, and it is understood that those changes and modifications also belong to the technical scope of the present disclosure.

Further, the effects described herein are merely explanatory or exemplary and are not limiting. That is, the techniques according to the present disclosure may exhibit other effects apparent to those skilled in the art from the description herein, in addition to or in place of the above effects.

The following configurations also belong to the technical scope of the present disclosure.

(1)

A photodetector comprising:

a separation region that is provided in a semiconductor substrate and defines a pixel region;

a hole accumulation region that is provided in the semiconductor substrate of the pixel region along a side surface of the separation region;

a multiplication region that is provided in the semiconductor substrate of the pixel region and is configured by joining a first conductivity type region and a second conductivity type region from the surface side of the semiconductor substrate in the thickness direction of the semiconductor substrate; and an insulating region provided in the semiconductor substrate in a region between the multiplication region and the hole accumulation region, wherein a formation depth of the insulating region is larger than a formation depth of the first conductivity type region.

(2)

The photodetector according to (1) above, wherein the formation depth of the insulating region is smaller than a formation depth of the second conductivity type region.

(3)

The photodetector according to (1) or (2) above, wherein the hole accumulation region is of a second conductivity type.

(4)

The photodetector according to (3) above, wherein the semiconductor substrate on the inner side with respect to the insulating region is further provided with a sub-accumulation region of the same conductivity type as the hole accumulation region.

(5)

The photodetector according to any one of (1) to (4) above, wherein the insulating region is configured of a plurality of regions separated from each other.

(6)

The photodetector according to (5) above, wherein the planar shape of the pixel region is a polygonal shape, and the plurality of regions of the insulating region are provided along each side of the pixel region.

(7)

The photodetector according to any one of (1) to (4) above, wherein the insulating region is provided over the entire circumference of the region between the multiplication region and the hole accumulation region.

(8)

The photodetector according to (7) above, wherein the planar shape of the pixel region is a polygonal shape, and the width of the insulating region corresponding to each vertex of the pixel region is larger than the width of the insulating region corresponding to each side of the pixel region.

(9)

The photodetector according to (7) above, wherein the planar shape of the pixel region is a polygonal shape, and the width of the insulating region corresponding to each vertex of the pixel region is smaller than the width of the insulating region corresponding to each side of the pixel region.

(10)

The photodetector according to any one of (7) to (9) above, wherein the planar shape of the pixel region is a polygonal shape, and the angle of each vertex of the polygonal shape is larger than 90 degrees.

(11) The photodetector according to any one of (1) to (10) above, wherein a plurality of the insulating regions is arranged between the multiplication region and the hole accumulation region.

(12) The photodetector according to any one of (1) to (11) above, wherein the shape of the insulating region in the thickness direction of the semiconductor substrate is reversely tapered from the surface side of the semiconductor substrate.

(13) The photodetector according to any one of (1) to (12) above, wherein the hole accumulation region is provided to further extend to a back surface side opposite to the surface of the semiconductor substrate where the multiplication region is provided.

(14) The photodetector according to (13) above, wherein a microlens that collects light is further provided on the back surface side of the semiconductor substrate.

(15) The photodetector according to any one of (1) to (14) above, wherein the hole accumulation region is electrically connected to an anode, and the first conductivity type region is electrically connected to a cathode.

(16) The photodetector according to any one of (1) to (15) above, wherein the separation region is configured of a double structure of a metal film extending in the thickness direction of the semiconductor substrate and an insulating film covering the side surface of the metal film.

(17) The photodetector according to any one of (1) to (16) above, wherein the second conductivity type region is provided in a projection region of the first conductivity type region when the surface of the semiconductor substrate is viewed in a plan view.

REFERENCE SIGNS LIST

1 Photodetector
11 First semiconductor substrate
12 First wiring layer
21 Second semiconductor substrate
22 Second wiring layer
33 Microlens
110N n-Type region
110P p-Type region
111N n-Type field-effect transistor
111P p-Type field-effect transistor
120, 220 Interlayer insulating film
121, 221 Wiring
210 Multiplication region
211 First conductivity type region
212 Second conductivity type region
213 Hole accumulation region
213P Anode
214 Metal film
215 Insulating film
216 Insulating region
217 Separation region
218 Sub-accumulation region

The invention claimed is:

1. A photodetector comprising:
a separation region that is provided in a semiconductor substrate and defines a pixel region;
a hole accumulation region that is provided in the semiconductor substrate of the pixel region along a side surface of the separation region;
a multiplication region that is provided in the semiconductor substrate of the pixel region and is configured by joining a first conductivity type region and a second conductivity type region from a surface side of the semiconductor substrate in a thickness direction of the semiconductor substrate; and
an insulating region provided in the semiconductor substrate in a region between the multiplication region and the hole accumulation region, wherein
a formation depth of the insulating region is larger than a formation depth of the first conductivity type region.

2. The photodetector according to claim 1, wherein the formation depth of the insulating region is smaller than a formation depth of the second conductivity type region.

3. The photodetector according to claim 1, wherein the hole accumulation region is of a second conductivity type.

4. The photodetector according to claim 3, wherein the semiconductor substrate on an inner side with respect to the insulating region is further provided with a sub-accumulation region of the same conductivity type as the hole accumulation region.

5. The photodetector according to claim 1, wherein the insulating region is configured of a plurality of regions separated from each other.

6. The photodetector according to claim 5, wherein
a planar shape of the pixel region is a polygonal shape, and
the plurality of regions of the insulating region are provided along each side of the pixel region.

7. The photodetector according to claim 1, wherein the insulating region is provided over an entire circumference of the region between the multiplication region and the hole accumulation region.

8. The photodetector according to claim 7, wherein
a planar shape of the pixel region is a polygonal shape, and
a width of the insulating region corresponding to each vertex of the pixel region is larger than a width of the insulating region corresponding to each side of the pixel region.

9. The photodetector according to claim 7, wherein
a planar shape of the pixel region is a polygonal shape, and
a width of the insulating region corresponding to each vertex of the pixel region is smaller than a width of the insulating region corresponding to each side of the pixel region.

10. The photodetector according to claim 7, wherein
a planar shape of the pixel region is a polygonal shape, and
an angle of each vertex of the polygonal shape is larger than 90 degrees.

11. The photodetector according to claim 1, wherein a plurality of the insulating regions is arranged between the multiplication region and the hole accumulation region.

12. The photodetector according to claim 1, wherein a shape of the insulating region in the thickness direction of the semiconductor substrate is reversely tapered from the surface side of the semiconductor substrate.

13. The photodetector according to claim 1, wherein the hole accumulation region is provided to further extend to a back surface side opposite to a surface of the semiconductor substrate where the multiplication region is provided.

14. The photodetector according to claim 13, wherein a microlens that collects light is further provided on the back surface side of the semiconductor substrate.

15. The photodetector according to claim 1, wherein the hole accumulation region is electrically connected to an anode, and the first conductivity type region is electrically connected to a cathode.

16. The photodetector according to claim 1, wherein the separation region is configured of a double structure of a metal film extending in the thickness direction of the semiconductor substrate and an insulating film covering the side surface of the metal film.

17. The photodetector according to claim 1, wherein the second conductivity type region is provided in a projection region of the first conductivity type region when the surface of the semiconductor substrate is viewed in a plan view.

* * * * *